(12) United States Patent
Tang et al.

(10) Patent No.: US 11,249,399 B2
(45) Date of Patent: Feb. 15, 2022

(54) PHOTOLITHOGRAPHY METHOD, METHOD OF PREPARING FLEXIBLE SUBSTRATE AND PHOTORESIST DRYING DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cheng Tang, Beijing (CN); Zebin Sun, Beijing (CN); Zhen Zhen, Beijing (CN); Hao Zhang, Beijing (CN); Shitao Zhang, Beijing (CN); Xinxing Fan, Beijing (CN); Xudong Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 289 days.

(21) Appl. No.: 16/406,759

(22) Filed: May 8, 2019

(65) Prior Publication Data

US 2020/0073247 A1 Mar. 5, 2020

(30) Foreign Application Priority Data

Sep. 5, 2018 (CN) .......................... 201811030146.5

(51) Int. Cl.
*G03F 7/20* (2006.01)
*G03F 7/00* (2006.01)
(Continued)

(52) U.S. Cl.
CPC ............ *G03F 7/2028* (2013.01); *G03F 7/004* (2013.01); *G03F 7/0035* (2013.01); *G03F 7/16* (2013.01); *G03F 7/2004* (2013.01)

(58) Field of Classification Search
None
See application file for complete search history.

(56) References Cited

U.S. PATENT DOCUMENTS

| 10,591,820 B2 | 3/2020 | Harumoto et al. |
| 2004/0189971 A1* | 9/2004 | Goo ..................... G03F 7/2028 355/67 |

(Continued)

FOREIGN PATENT DOCUMENTS

| CN | 1582074 A | 2/2005 |
| CN | 101154583 A | 4/2008 |

(Continued)

OTHER PUBLICATIONS

The first Chinese office action dated Mar. 12, 2021; Appln. No. 201811030146.5.

*Primary Examiner* — Kathleen Duda (57) ABSTRACT

A photolithography method, a method of preparing a flexible substrate and a photoresist drying device are provided. The photolithography method includes: providing a base substrate on which a material layer to be etched is formed, in which the base substrate includes an intermediate region and a peripheral region surrounding the intermediate region; coating a layer of photoresist on the base substrate, in which the photoresist is coated in the intermediate region and the peripheral region, and is formed to cover the material layer to be etched; and drying the photoresist and simultaneously performing a first exposure process on the photoresist coated in the peripheral region.

9 Claims, 5 Drawing Sheets

(51) Int. Cl.
  *G03F 7/004* (2006.01)
  *G03F 7/16* (2006.01)

(56) References Cited

U.S. PATENT DOCUMENTS

| | | |
|---|---|---|
| 2005/0031902 A1 | 2/2005 | Uchida et al. |
| 2006/0194155 A1* | 8/2006 | Kawamura ........... G03F 7/2022 430/394 |
| 2008/0081297 A1 | 4/2008 | Sim et al. |
| 2015/0044392 A1 | 2/2015 | Kobayashi |
| 2018/0180920 A1* | 6/2018 | Zhang ............... G02F 1/133516 |

FOREIGN PATENT DOCUMENTS

| | | |
|---|---|---|
| CN | 104342164 A | 2/2015 |
| CN | 108319057 A | 7/2018 |
| EP | 0586470 B | 3/1998 |
| JP | 2017147329 A | 8/2017 |

* cited by examiner

PHOTOLITHOGRAPHY METHOD, METHOD OF PREPARING FLEXIBLE SUBSTRATE AND PHOTORESIST DRYING DEVICE

CROSS-REFERENCE TO RELATED APPLICATION

The present application claims priority of Chinese patent application No. 201811030146.5, filed on Sep. 5, 2018, the disclosure of which is incorporated herein by reference as part of the application.

TECHNICAL FIELD

At least one embodiment of the present disclosure relates to a photolithography method, a method of preparing a flexible substrate and a photoresist drying device.

BACKGROUND

Photolithography technology refers to a technique of transferring a pattern on a mask to a substrate to be etched by means of a photoresist under an effect of illumination. For example, main processes of the photolithography technology include: irradiating light emitted by a light source onto a surface of a substrate to be etched on which a layer of photoresist film is coated through a mask, such that the photoresist in an exposed region is chemically reacted; then, dissolving and removing the photoresist in the exposed region or an unexposed region by a development process (the former is a positive photoresist, the latter is a negative photoresist), such that the pattern on the mask is copied onto the photoresist film; finally, the pattern on the photoresist film is transferred to the substrate to be etched by an etching process.

SUMMARY

At least one embodiment of the present disclosure provides a photolithography method, the method comprises: providing a base substrate on which a material layer to be etched is formed, in which the base substrate comprises an intermediate region and a peripheral region surrounding the intermediate region; coating a layer of photoresist on the base substrate, in which the photoresist is coated in the intermediate region and the peripheral region, and is formed to cover the material layer to be etched; and drying the photoresist and simultaneously performing a first exposure process on the photoresist coated in the peripheral region.

For example, in a photolithography method according to at least one embodiment of the present disclosure, after the photoresist is dried and the first exposure process is completed, the method further comprises: performing a second exposure process on the photoresist coated in at least the intermediate region.

For example, in a photolithography method according to at least one embodiment of the present disclosure, the second exposure process is performed to the photoresist coated in the intermediate region and the peripheral region simultaneously.

For example, in a photolithography method according to at least one embodiment of the present disclosure, after the second exposure process is completed, the method further comprises: performing a development process on the photoresist coated in the intermediate region and the peripheral region, so as to form a photoresist pattern in the intermediate region of the base substrate and remove the photoresist in the peripheral region; and the photoresist pattern is used as an etching mask.

For example, in a photolithography method according to at least one embodiment of the present disclosure, the first exposure process comprises: guiding light emitted from an exposure light source by a light guiding device, so as to allow an emission range of the light guided by the light guiding device to correspond to the peripheral region.

For example, in a photolithography method according to at least one embodiment of the present disclosure, the photoresist is a positive photoresist.

At least one embodiment of the present disclosure provides a method of preparing a flexible substrate, the method comprises: forming a flexible material layer on a support substrate, in which the support substrate comprises a flexible substrate formation region and a peripheral region surrounding the flexible substrate formation region; performing a patterning process on the flexible material layer by a photolithography process, in which the photolithography process comprises coating a layer of photoresist and drying the photoresist, and the photoresist is coated in the flexible substrate formation region and the peripheral region; and performing a first exposure process on the photoresist coated in the peripheral region while drying the photoresist.

For example, in a method of preparing a flexible substrate according to at least one embodiment of the present disclosure, after the photoresist is dried and the first exposure process is completed, the method further comprises: performing a second exposure process on the photoresist coated in at least the flexible substrate formation region.

For example, in a method of preparing a flexible substrate according to at least one embodiment of the present disclosure, the photoresist is a positive photoresist.

For example, in a method of preparing a flexible substrate according to at least one embodiment of the present disclosure, after the second exposure process is completed, the method further comprises: performing a development process on the photoresist coated in the flexible substrate formation region and the peripheral region, so as to form a photoresist pattern in the flexible substrate formation region and remove the photoresist in the peripheral region; and the photoresist pattern is used as an etching mask for the patterning process.

For example, in a method of preparing a flexible substrate according to at least one embodiment of the present disclosure, the first exposure process comprises: guiding light emitted from an exposure light source by a light guiding device, so as to allow an emission range of the light guided by the light guiding device to correspond to the peripheral region.

For example, in a method of preparing a flexible substrate according to at least one embodiment of the present disclosure, the emission range of the light is formed in a rectangular frame shape, and a width of a frame of the rectangular frame ranges from 8 mm to 15 mm.

For example, a method of preparing a flexible substrate according to at least one embodiment of the present disclosure further comprises: after the photolithography process is completed, stripping off the flexible material layer from the support substrate to form the flexible substrate.

At least one embodiment of the present disclosure provides a photoresist drying device, the photoresist drying device comprises: at least one carrying machine table, comprising a carrying region for carrying a substrate to be operated; a heating device for drying the substrate to be operated on the carrying machine table; and an exposure device, comprising an exposure light source and a light guiding device; the light guiding device is configured to be capable of guiding light emitted by the exposure light source, so as to allow an emission range of the light guided by the light guiding device to correspond to an edge region of the substrate to be operated.

For example, a photoresist drying device according to at least one embodiment of the present disclosure further comprises: a limiting structure on the carrying machine table for defining the carrying region.

For example, in a photoresist drying device according to at least one embodiment of the present disclosure, the exposure light source is an ultraviolet light source.

For example, in a photoresist drying device according to at least one embodiment of the present disclosure, the light guiding device is configured to allow the emission range of the light guided by the light guiding device to be formed in a rectangular frame shape, and a width of a frame of the rectangular frame ranges from 8 mm to 15 mm.

For example, in a photoresist drying device according to at least one embodiment of the present disclosure, the exposure device comprises four light guiding devices; and the four light guiding devices are configured to guide the light emitted by the exposure light source, so as to allow the emission ranges of the light guided by the four light guiding devices to respectively correspond to four sides of the rectangular frame.

For example, in a photoresist drying device according to at least one embodiment of the present disclosure, the exposure device comprises four exposure light sources; and the four light guiding devices are configured to respectively guide the light emitted by the four exposure light sources, so as to allow the emission ranges of the light guided by the four light guiding devices to respectively correspond to the four sides of the rectangular frame.

For example, in a photoresist drying device according to at least one embodiment of the present disclosure, the heating device is on a side of the carrying machine table away from the exposure device.

In the photolithography method provided by at least one embodiment of the present disclosure, the first exposure process is performed on the photoresist in the peripheral region while the photoresist is dried, production time can be saved, and the photoresist in the peripheral region can be more sufficiently exposed.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "on," "under," "left," "right," or the like are only used to indicate relative position relationship, and when the position of the object which is described is changed, the relative position relationship may be changed accordingly.

A photolithography process generally includes processes such as photoresist coating, exposure, development, etching and so on. In a case where a patterned functional layer is formed on a base substrate by the photolithography process, due to an unevenness of the photoresist coating or an unevenness of the exposure, there may be problems, such as uneven coating of the photoresist, uneven exposure of the photoresist and so on, in an edge region and an intermediate region of the base substrate, such that the photoresist located in the edge region cannot be sufficiently exposed.

For example, in a preparation process of a flexible substrate, it is generally required to form a flexible substrate by means of a support substrate. First, forming a flexible substrate on the support substrate by steps such as coating a polymer material, curing, etc., then preparing at least one functional layer on the flexible substrate by, for example, a photolithography process, and stripping off the flexible substrate from the support substrate after the functional layer is prepared. In the preparation process, the flexible substrate material is generally formed in an intermediate region of the support substrate, so when the functional layer is formed on the flexible substrate, the photoresist is inevitably coated on an edge portion of the support substrate simultaneously, such as the photoresist is coated in a junction position of the flexible substrate and the support substrate. Since the flexible substrate is generally formed to have a certain thickness, there is a height difference, for example, a height difference of 20 µm, between the edge portion of the support substrate and the surface of the flexible substrate, thereby the edge portion of the support substrate tends to accumulate relatively thick photoresists, which are difficult to be completely exposed by a subsequent exposure process, and these accumulated photoresists are likely to remain after a development process. Due to an adhesion effect of the remained photoresists, the flexible substrate may have difficulty in separating from the support substrate in a subsequent stripping process; and in addition, the remained photoresists may also affect a patterning process of each of the functional layers on the flexible substrate such that a pattern of each of the formed functional layers deviates from a target pattern.

For example, in order to completely remove the photoresist on the edge portion of the support substrate, an edge exposure process is generally additionally added after the exposure process, for example, a complementary exposure is performed to an edge of a width of about 15 mm of the support substrate, such that the photoresist on the edge portion of the support substrate is sufficiently exposed, and the photoresist can be completely dissolved and removed in the subsequent development process. However, this edge exposure process generally increases production time, adversely affects production, and increases manufacturing costs. In addition, in actual production, in order to ensure the yield, the production time of each of substrates is generally limited, so the time of the added edge exposure process cannot be too long, such that sometimes it is also difficult for the edge exposure process to sufficiently expose the photoresist on the edge portion of the support substrate, which still causes the photoresist to remain. The remained photoresist not only affects the stripping process of the flexible substrate, but may also affect the patterning process of a functional layer on the flexible substrate.

At least one embodiment of the present disclosure provides a photolithography method, the method comprises: providing a base substrate on which a material layer to be etched is formed, in which the base substrate comprises an intermediate region and a peripheral region surrounding the intermediate region; coating a layer of photoresist on the base substrate, in which the photoresist is coated in the intermediate region and the peripheral region, and is formed to cover the material layer to be etched; and drying the photoresist and simultaneously performing a first exposure process on the photoresist coated in the peripheral region.

At least one embodiment of the present disclosure provides a method of preparing a flexible substrate, the method comprises: forming a flexible material layer on a support substrate, in which the support substrate comprises a flexible substrate formation region and a peripheral region surrounding the flexible substrate formation region; performing a patterning process on the flexible material layer by a photolithography process, in which the photolithography process comprises coating a layer of photoresist and drying the photoresist, and the photoresist is coated on the flexible substrate formation region and the peripheral region; and performing a first exposure process on the photoresist coated in the peripheral region while drying the photoresist.

At least one embodiment of the present disclosure provides a photoresist drying device, the photoresist drying device comprises: at least one carrying machine table, comprising a carrying region for carrying the substrate to be operated; a heating device for drying the substrate to be operated on the carrying machine table; and an exposure device comprising an exposure light source and a light guiding device; the light guiding device is configured to be capable of guiding light emitted by the exposure light source, so as to allow an emission range of the light guided by the light guiding device to correspond to an edge region of the substrate to be operated.

Hereinafter, the photolithography method, the method of preparing a flexible substrate, and the photoresist drying device of the present disclosure will be described by some specific embodiments.

Figure 1:
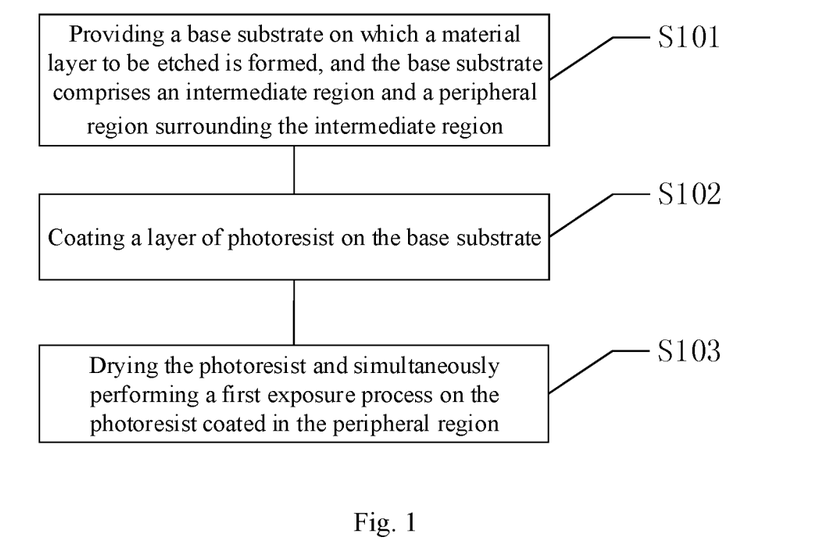
FIG. 1 is a flow diagram of a photolithography method according to at least one embodiment of the present disclosure.

At least one embodiment of the present disclosure provides a photolithography method, the photolithography method may be used, for example, to prepare a flexible substrate or the like. As shown in FIG. 1, the photolithography method includes steps S101-S103.

Step S101: providing a base substrate on which a material layer to be etched is formed, and the base substrate includes an intermediate region and a peripheral region surrounding the intermediate region.

Figure 2A:
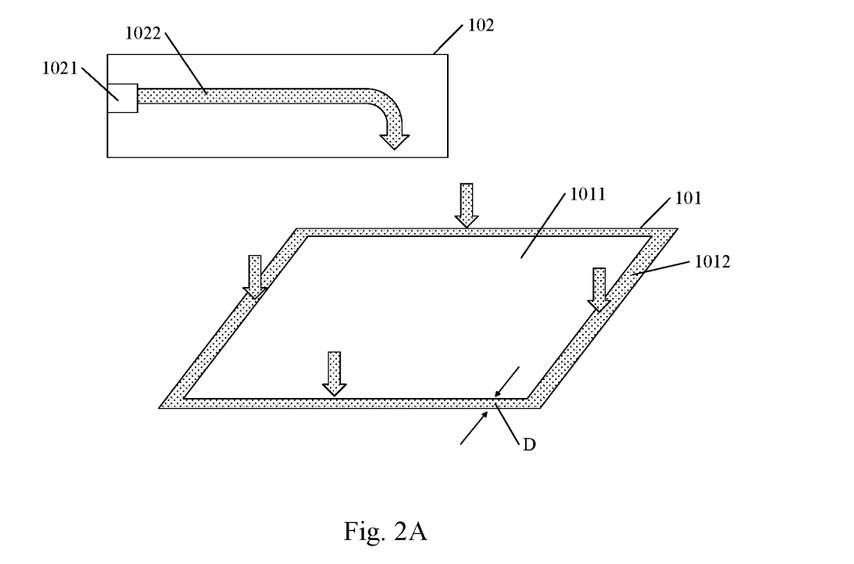
FIG. 2A is an operation diagram of a photolithography method according to at least one embodiment of the present disclosure.
Figure 2B:
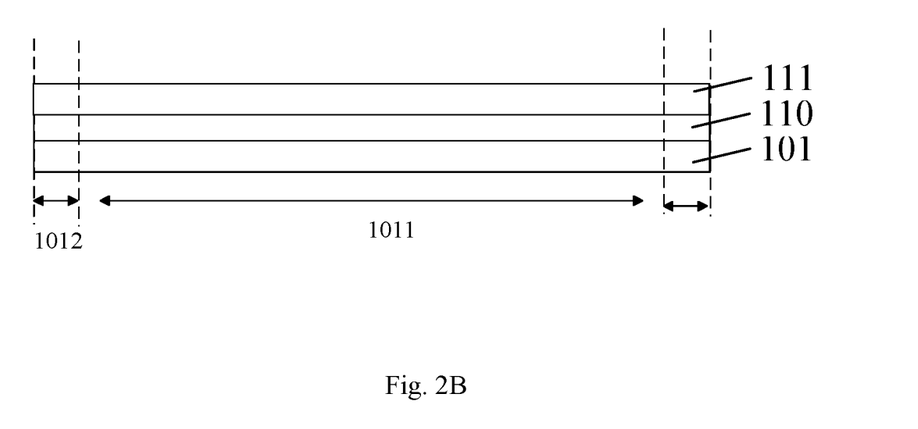
FIG. 2B is a cross-sectional view of a base substrate according to at least one embodiment of the present disclosure.

As shown in FIG. 2A and FIG. 2B (FIG. 2B is a cross-sectional view of the base substrate shown in FIG. 2A), the base substrate 101 includes an intermediate region 1011 and a peripheral region 1012 surrounding the intermediate region 1011. For example, the material layer 110 to be etched may be formed in the intermediate region 1011, alternatively, the material layer 110 to be etched is formed in both of the intermediate region 1011 and the peripheral region 1012 (the case shown in FIG. 2B).

For example, the base substrate 101 may be a substrate made of a material such as glass or quartz. The material layer 110 to be etched may be, for example, an organic material or an inorganic material. For example, in a case where the material layer 110 to be etched is used to form a conductive structure such as an electrode, a lead line, or the like, the material to be etched may be a metal material, polysilicon, a conductive oxide (for example, ITO, IGZO, or the like), or the like; in a case where the material layer 110 to be etched is used to form an insulating layer which is used to provide insulation, via holes, and the like, the material to be etched may be an organic insulating material or an inorganic insulating material, which is not limited in this embodiment.

Step S102: coating a layer of photoresist on the base substrate, and the photoresist is coated in the intermediate region and the peripheral region.

As shown in FIG. 2A and FIG. 2B, a photoresist 111 is coated in the intermediate region 1011 and the peripheral region 1012. For example, the photoresist 111 is used to perform a patterning process on the material layer 110 to be etched to pattern the material layer 110 to be etched. In this embodiment, for example, the photoresist is a positive photoresist, and the positive photoresist can be dissolved and removed in a development process after being exposed.

Step S103: drying the photoresist and simultaneously performing a first exposure process on the photoresist coated in the peripheral region.

In this embodiment, the coated photoresist may be dried by a drying process or by a baking process (i.e., the coated photoresist may be baked). In this case, for example, a heating device such as an infrared heating device may be used to heat the photoresist to accelerate an evaporation of a solvent in the photoresist, so as to achieve a drying effect.

In this embodiment, before the drying process, for example, a vacuum pre-drying process may be performed, that is, placing the base substrate coated with the photoresist under a vacuum environment, such that most of the solvent in the photoresist is removed because a phenomenon that an evaporation rate of the solvent is increased under the vacuum environment. The pre-drying process can further shorten the time of the drying process and improve production efficiency.

In this embodiment, the first exposure process is performed on the photoresist located in the peripheral region while the photoresist is being dried, that is, the drying process of the photoresist is performed simultaneously with the first exposure process of the photoresist. This processing method saves process time and allows the photoresist located in the peripheral region to be sufficiently exposed.

It should be noted that, in the above embodiment, "simultaneously" means that the performing time of drying the photoresist and the performing time of the first exposure process at least partially coincide with each other. For example, in one example, the time of drying the photoresist is long, so that the first exposure process can be performed at a certain period of time during the drying of the photoresist. For example, the start time of the first exposure process is later than the start time of drying the photoresist, and the end time of the first exposure process can be earlier than the end time of drying the photoresist, alternatively, the end time of the first exposure process can be identical to the end time of drying the photoresist, alternatively, the end time of the first exposure process can be later than the end time of drying the photoresist, which is not limited in the embodiments of the present disclosure.

For example, as shown in FIG. 2A, the first exposure process is performed by an exposure device 102, the exposure device 102 includes an exposure light source 1021 and a light guide device 1022. For example, the first exposure process comprises: guiding light emitted from the exposure light source 1021 by the light guiding device 1022, so as to allow the emission range of the light guided by the light guiding device 1022 to correspond to the peripheral region 1012 of the base substrate 101, thus, the first exposure process can complete the exposure of the photoresist located in the peripheral region 1012.

For example, the emission range of the light guided by the light guiding device 1022 may completely correspond to the peripheral region 1012 of the base substrate 101, or may partially correspond to the peripheral region 1012 of the base substrate 101, which is not limited in the embodiments of the present disclosure.

For example, in the embodiment, the emission range of the light guided by the light guiding device 1022 is formed in a rectangular frame shape, and a width of the frame of the rectangular frame ranges from about 8 mm to about 15 mm, such as 10 mm, 12 mm, 15 mm or the like. In this embodiment, the width of the frame of the rectangular frame refers to a distance between an adjacent inner frame edge and an outer frame edge in the rectangular frame. As shown in FIG. 2A, the width of the frame of the rectangular frame is illustrated as "D". This width can be configured according to actual needs. In this embodiment, since a shape of the peripheral region 1012 of the base substrate 101 is generally a rectangular frame shape, the light guiding device 1022 is configured correspondingly, such that the emission range of the light guided by the light guiding device 1022 can more accurately correspond to the peripheral region 1012, thereby an utilization rate of the light emitted by the exposure light source 1021 can be increased, and exposure positions can be more accurate. For example, in a case where the peripheral region 1012 is in a rectangular frame shape, the emission range of the light guided by the light guiding device 1022 can correspond to at least one side of the rectangular frame.

For example, the type of the exposure light source 1021 may be selected according to the needs of the process, for example, the exposure light source 1021 may be a visible light source, an ultraviolet light source, a far ultraviolet light source, or the like, and the exposure light source 1021 may be an excimer laser, a gas carbon dioxide laser, or the like, and the exposure light source 1021 may be a point light source, a line light source, or the like. The light guide device 1022 may include a lens, a reflector mirror, a light guide column, a beam splitter, or the like, so as to guide the light emitted by the exposure light source in a predetermined shape (for example, a point shape, a line shape, or the like) to a predetermined position.

For example, in the embodiment, an exposure energy of the first exposure process is greater than 1000 mJ/cm$^2$. For example, an exposure intensity of the first exposure process is greater than 20 mW/cm$^2$, and accordingly, exposure time of the first exposure process is greater than 50 s. In this embodiment, the exposure energy of the first exposure process can be selected according to the material, the thickness, and the like of the photoresist, and the exposure intensity and the exposure time are selected according to the selected exposure energy and the available production time, which is not limited in this embodiment.

Figure 3:
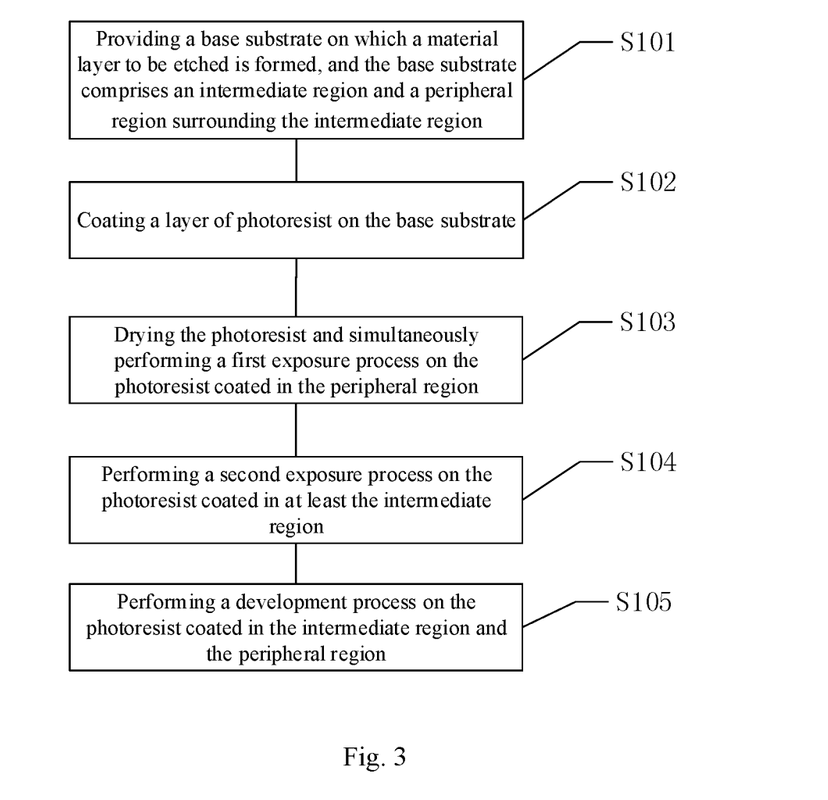
FIG. 3 is a flow diagram of another photolithography method according to at least one embodiment of the present disclosure.

In one embodiment, as shown in FIG. 3, after the photoresist is dried and the first exposure process is completed, the photolithography method may further include steps S104-S105.

Step S104: performing a second exposure process on the photoresist coated in at least the intermediate region.

In this embodiment, the second exposure process may only include exposing the photoresist located in the intermediate region; alternatively, the second exposure process may include simultaneously exposing the photoresist located in the intermediate region and the peripheral region.

For example, the photoresist in the intermediate region is exposed such that a photoresist pattern may be formed in the intermediate region in a subsequent development process, and the photoresist pattern may be used as a mask for patterning the material layer to be etched. For example, the second exposure process may further include exposing the photoresist in the peripheral region, and in this case, two exposure processes, that is, a first exposure process and a second exposure process, are performed on the photoresist located in the peripheral region, thereby the photoresist located in the peripheral region can be ensured to be completely exposed.

Step S105: performing a development process on the photoresist coated in the intermediate region and the peripheral region.

In this embodiment, simultaneously performing a development process on the photoresist in the intermediate region and the peripheral region. For example, in a case where the photoresist is a positive photoresist, the exposed photoresist can be dissolved and removed by the development process to form a photoresist pattern in the intermediate region of the base substrate, and the photoresist pattern is used as an etching mask for the material to be etched, so as to pattern the material layer to be etched in an etching process; and at the same time, the photoresist in the peripheral region can be removed in the development process.

In this embodiment, after the development process, the photolithography method further includes performing an etching process on the material layer to be etched, that is, the material layer to be etched is patterned by using the photoresist pattern located in the intermediate region as an etching mask to form a patterned functional layer. The etching process may be a wet etching process or a dry etching process.

In the photolithography method provided by the embodiments of the present disclosure, the first exposure process is performed on the photoresist located in the peripheral region while the photoresist is dried, production time can be saved, and the photoresist located in the peripheral region can be more sufficiently exposed. In addition, since the photoresist is not completely cured during the drying process of the photoresist, the photoresist is more susceptible to be photo decomposed during a heating state of the drying process, and therefore the performing of the first exposure process while the photoresist is dried can also improve an exposure efficiency of the first exposure process. For example, the photolithography method can be used to prepare a structure such as an array substrate or the like which has functional layers such as a display circuit, a driving circuit and the like. The array substrate may be flexible or non-flexible. In this application, the photoresist located in the edge portion of the array substrate can be sufficiently exposed by the photolithography method during the preparation process, thereby no photoresist remains on the array substrate after the development process, such that the obtained photoresist pattern is more accurate, and the patterns of the functional layers such as the display circuit, the driving circuit and so on formed by the photolithography process is more in line with expected patterns. In addition, in a case where the prepared array substrate is a flexible substrate, no photoresist remains on the edge of the flexible substrate, such that the stripping process of the flexible array substrate can be simpler and easier.

Figure 4:
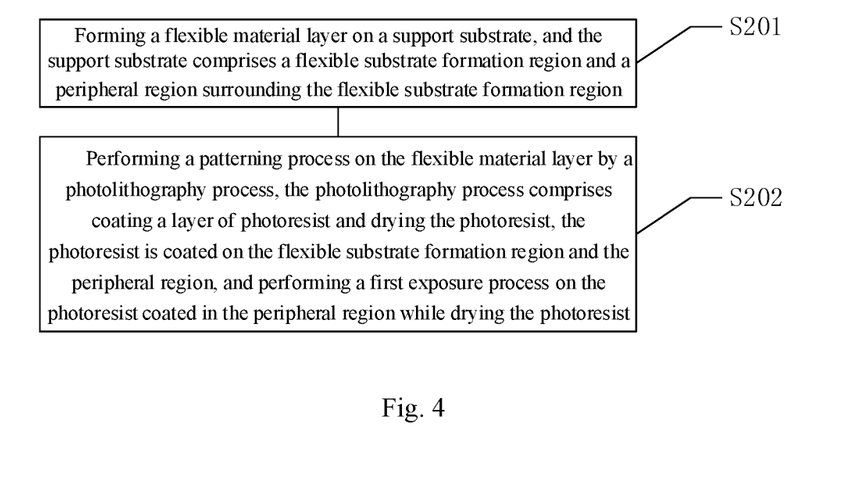
FIG. 4 is a flow diagram of a method of preparing a flexible substrate according to at least one embodiment of the present disclosure.

At least one embodiment of the present disclosure provides a method of preparing a flexible substrate, and as shown in FIG. 4, the preparation method includes steps S201-S202.

Step S201: forming a flexible material layer on a support substrate, and the support substrate includes a flexible substrate formation region and a peripheral region surrounding the flexible substrate formation region.

Figure 5:
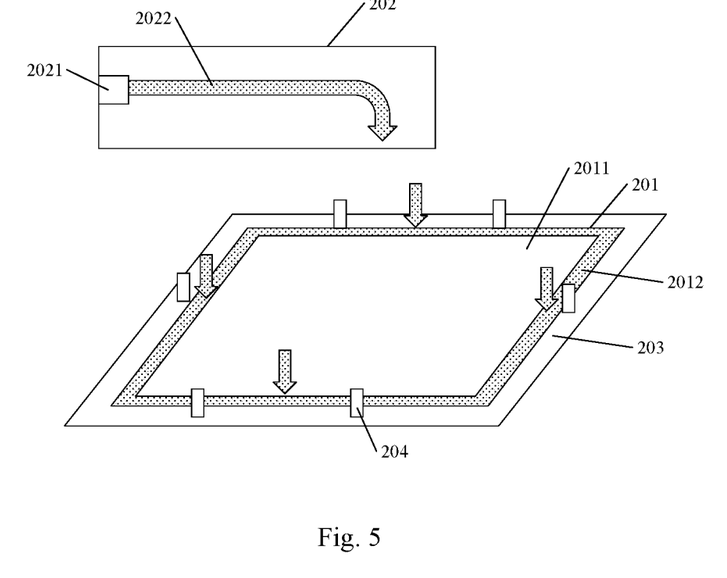
FIG. 5 is a schematic diagram of a flexible substrate in a preparation process according to at least one embodiment of the present disclosure.

As shown in FIG. 5, the support substrate 201 includes a flexible substrate formation region 2011 and a peripheral region 2012 surrounding the flexible substrate formation region 2011. For example, a flexible material layer is formed in the flexible substrate formation region 2011; and of course, due to process precision or the like or other requirements, the flexible material layer may also be formed in a portion of the peripheral region 2012.

For example, the support substrate 201 is a rigid base substrate, and for example, the support substrate 201 may be a substrate made of glass, quartz, stainless steel, or the like. For example, the flexible material layer may be a flexible organic material such as polyimide (PI) or the like, which is not limited in this embodiment.

For example, the above operation may be performed on a carrying machine table 203. In this case, the support substrate 201 is carried on the carrying machine table 203, and is defined and fixed by a limiting device 204.

Step S202: performing a patterning process on the flexible material layer by a photolithography process, the photolithography process includes coating a layer of photoresist and drying the photoresist, and the photoresist is coated in the flexible substrate formation region and the peripheral region; and performing a first exposure process on the photoresist coated in the peripheral region while drying the photoresist.

In this embodiment, performing a patterning process on the flexible material layer by a photolithography process may include patterning the flexible material layer itself by the photolithography process, or may include forming another functional layer on the flexible material layer by the photolithography process, for example, forming a display circuit/device, a drive circuit and the like for display. In this case, it is required to form a material layer to be etched on the flexible material layer in advance, and then perform the patterning process by the photolithography process. For example, the display circuit/device includes a structure such as a cathode, an anode, a light-emitting layer, and the like, and the driving circuit includes a thin film transistor (for example, including a switching transistor, a driving transistor, and the like), a storage capacitor, a gate line, a data line, and the like, which is not limited in this embodiment.

For example, in this embodiment, the first exposure process is performed by an exposure device 202, and the exposure device 202 includes an exposure light source 2021 and a light guiding device 2022. For example, the first exposure process may include: guiding light emitted from the exposure light source 2021 by the light guiding device 2022, so as to allow an emission range of the light guided by the light guiding device 2022 to correspond to the peripheral region 2012, thereby the first exposure process can complete the exposure of the photoresist located in the peripheral region 2012.

For example, in the embodiment, the emission range of the light guided by the light guiding device 2022 is formed in a rectangular frame shape, and a width of the frame of the rectangular frame ranges from about 8 mm to 15 mm, such as 10 mm, 12 mm, 15 mm or the like. This width may be configured according to actual needs. In this embodiment, since a shape of the peripheral region 2012 of the support substrate 201 is generally a rectangular frame shape, the light guiding device 2022 is configured correspondingly, such that the emission range of the light guided by the light guiding device 2022 can more accurately correspond to the peripheral region 2012, thereby an utilization rate of the light emitted by the exposure light source can be increased, and exposure positions can be more accurate.

For example, in the embodiment, an exposure energy of the first exposure process is greater than 1000 mJ/cm$^2$. For example, an exposure intensity of the first exposure process is greater than 20 mW/cm$^2$, and accordingly, an exposure time of the first exposure process is greater than 50 s. In this embodiment, the exposure energy of the first exposure process may be selected according to the material, the thickness, and the like of the photoresist, and the exposure intensity and the exposure time are selected according to the selected exposure energy and the available production time, which is not limited in this embodiment.

Figure 6:
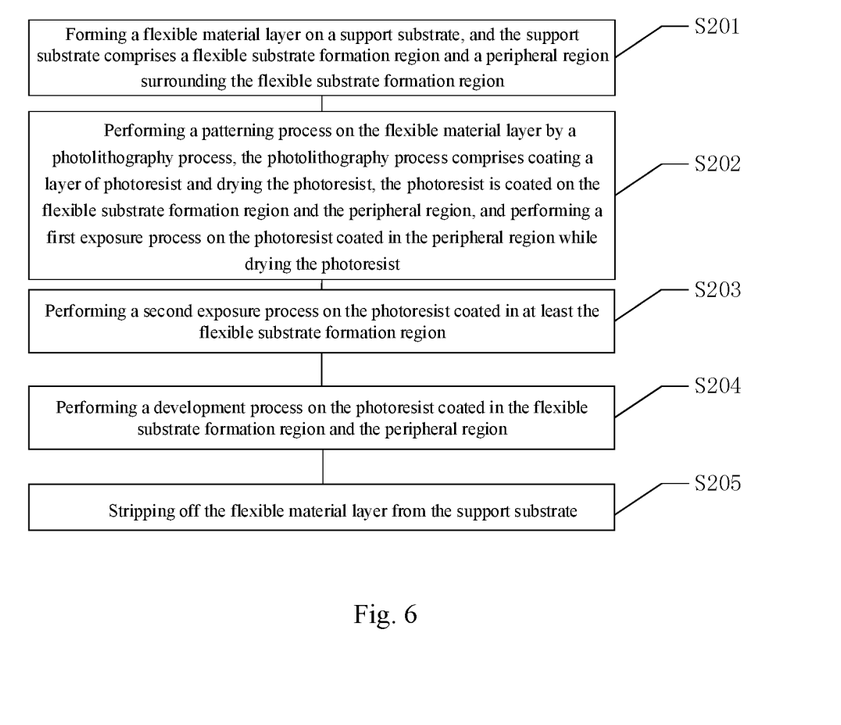
FIG. 6 is a flow diagram of another method of preparing a flexible substrate according to at least one embodiment of the present disclosure.

In one embodiment, as shown in FIG. 6, a method of preparing a flexible substrate may further include steps S203-S205.

Step S203: performing a second exposure process on the photoresist coated in at least the flexible substrate formation region.

In this embodiment, the second exposure process may only include exposing the photoresist located in the flexible substrate formation region; alternatively, the second exposure process may include simultaneously exposing the photoresist located in the flexible substrate formation region and the peripheral region. The exposure energy of the first exposure process may be selected according to the material, the thickness, and the like of the photoresist, which is not limited in this embodiment.

For example, the photoresist in the flexible substrate formation region is exposed such that a photoresist pattern may be formed in the flexible substrate formation region in a subsequent development process, and the photoresist pattern can be used as an etching mask. For example, the second exposure process may further include exposing the photoresist in the peripheral region, and in this case, two exposure processes, that is, a first exposure process and a second exposure process, are performed on the photoresist located in the peripheral region, thereby the photoresist located in the peripheral region can be ensured to be completely exposed.

Step S204: performing a development process on the photoresist coated in the flexible substrate formation region and the peripheral region.

In this embodiment, the development process is simultaneously performed on the photoresist in the flexible substrate formation region and the peripheral region. For example, in a case where the photoresist is a positive photoresist, the exposed photoresist can be dissolved and removed by the development process to form a photoresist pattern in the flexible substrate formation region of the support substrate and remove the photoresist located in the peripheral region; and the photoresist pattern is used as an etching mask for patterning. For example, the photoresist pattern is used to form functional layers such as a display circuit, a driving circuit and the like by patterning on the flexible material layer.

In this embodiment, after the development process, an etching process is performed, that is, a pre-formed material layer to be etched is patterned by using the photoresist pattern located in the intermediate region as an etching mask to form patterned functional layers, for example, forming functional layers such as a display circuit/device, a drive circuit and the like.

Step S205: stripping off the flexible material layer from the support substrate.

For example, in this embodiment, after a plurality of the above photolithography processes are performed to complete the patterning of the required functional layers on the flexible material layer, the flexible material layer is stripped from the support substrate by a stripping process, such as a laser irradiation strip process, to form a flexible substrate. The flexible substrate can be used to implement a flexible display, and for example, can be used in various display devices.

In this embodiment, after the first exposure process, or after the first exposure process and the second exposure process, the photoresist located in the peripheral region 2012 of the support substrate 201 is completely exposed, thereby the photoresist located in the peripheral region 2012 can be completely dissolved and removed in the development process, and in a case where the flexible material layer is stripped from the support substrate 201, the flexible material layer is not adhered by a remained photoresist, which is formed in the conventional process and causes the stripping of the flexible material layer to be difficult. Therefore, the method of preparing the flexible substrate of the embodiment can not only form functional layers such as a display circuit, a driving circuit pattern and the like of which the patterns are more in line with the expected patterns by a photolithography process, but also can make the stripping process of the flexible substrate simpler and easier.

Figure 7:
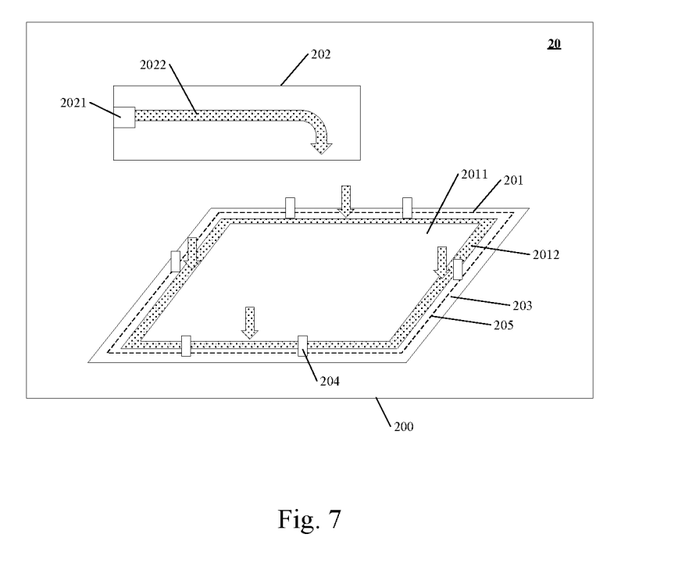
FIG. 7 is a schematic diagram of a photoresist drying device according to at least one embodiment of the present disclosure.

At least one embodiment of the present disclosure provides a photoresist drying device, as shown in FIG. 7, the photoresist drying device 20 includes at least one carrying machine table 203, a heating device 205 and an exposure device 202. The carrying machine table 203 includes a carrying region for carrying the substrate to be operated, the heating device 205 is used for drying the substrate to be operated on the carrying machine table, and the exposure device 202 includes an exposure light source 2021 and a light guiding device 2022. The light guiding device 2022 is configured to be capable of guiding light emitted by the exposure light source 2021, so as to allow an emission range of the light guided by the light guiding device 2022 to correspond to an edge region of the substrate to be operated.

For example, as shown in FIG. 7, the photoresist drying device 20 further includes an outer casing 200, and the respective members of the photoresist drying device 20, such as the carrying machine table 203, the heating device 205, the exposure device 202, and the like, are disposed in the outer casing 200. The outer casing 200 may be made of plastic, metal or the like, and may include a glass window to allow operators to observe and monitor operation processes.

For example, in the embodiment, the heating device 205 may be disposed on a side of the carrying machine table 203 away from the exposure device 202, such that the heating device 205 does not block the light emitted by the exposure device 202. For example, as shown in FIG. 7, the heating device 205 may be disposed at a position below the carrier table 203 and corresponds to the dotted frame in the drawing, For example, an installation position of the heating device 205 corresponds to the carrying region, such that the heat emitted by the heating device 205 can be sufficiently transmitted to the substrate to be operated carried on the carrying region. In this embodiment, the heating device 205 may be an infrared heating device, a resistance heating device, or the like, alternatively, the heating device 205 may be a heating gas introduction device, and the heating gas can be provided by other heating gas generating devices, which is not limited in this embodiment.

For example, as shown in FIG. 7, the photoresist drying device 20 may further include a limiting structure 204, and the limiting structure 204 is disposed on the carrying machine table 203 for defining the carrying region, that is, for defining a carrying position of the substrate to be operated, and preventing a position shift of the substrate to be operated. For example, as shown in FIG. 7, the limiting structure 204 includes a plurality of columnar limiting units, and the plurality of columnar limiting units are evenly distributed on the edges of the carrying region. For example, in other examples, the limiting structure 204 also includes a plurality of walls disposed along each of the edges of the carrying region. The specific structure of the limiting structure 204 is not limited in this embodiment, as long as the limiting structure 204 can implement a limiting function.

For example, the exposure device 202 may include an inductive switch, the inductive switch is configured to be turned on in a case where an object, such as an substrate to be operated, is transferred to the carrying machine table 203, and the exposure device 202 performs one exposure process; and in a case where an object, such as a substrate to be operated, is removed from the carrying machine table 203, the inductive switch is turned off, and the exposure device 202 stops the exposure process. For example, the inductive switch is a photosensitive switch, such that the function of the switch can be realized by sensing whether sensing light of the inductive switch is blocked by the substrate to be operated.

For example, in this embodiment, the exposure light source 2021 may be an ultraviolet light source. For example, the ultraviolet light source may emit ultraviolet light having a wavelength ranges from about 300 nm to about 400 nm, for example, the ultraviolet light may have a wavelength of about 340 nm, 360 nm, 380 nm or the like; and for another example, as previously described, the exposure source 2021 may also be a light source of any other type or form.

For example, in this embodiment, the light guiding device 2022 may include a plurality of lens components, and each of the lens components can reflect and/or refract the light emitted by the exposure light source 2021, thereby a propagation path of the light can be guided by a cooperation of the plurality of the lens components; and for another example, as previously described, the light guiding device 2022 can also include other optical devices.

For example, in the embodiment, the light guiding device 2022 is configured to allow the emission range of the light guided by the light guiding device 2022 to be formed in a rectangular frame shape, and a width of the frame of the rectangular frame ranges from about 8 mm to about 15 mm, such as 10 mm, 12 mm, 15 mm, or the like. This width can be configured according to actual needs. Since a shape of the peripheral region 2012 of the support substrate 201 is generally a rectangular frame shape, the light guiding device 2022 can be configured correspondingly, such that the emission range of the light guided by the light guiding device 2022 can more accurately correspond to the peripheral region 2012, thereby an utilization rate of the light emitted by the exposure light source 2021 can be increased, and exposure positions can be more accurate.

For example, in the embodiment, an exposure energy of the exposure device 202 for performing one exposure process is greater than 1000 mJ/cm$^2$. For example, an exposure intensity of the exposure device 202 for performing one exposure process is greater than 20 mW/cm$^2$, and accordingly, an exposure time of the first exposure process is greater than 50 s. In this embodiment, the exposure energy of the exposure device 202 for performing one exposure process may be selected according to the material, the thickness, and the like of the photoresist, and the exposure intensity and the exposure time are selected according to the selected exposure energy and the available production time, which is not limited in this embodiment.

Figure 8:
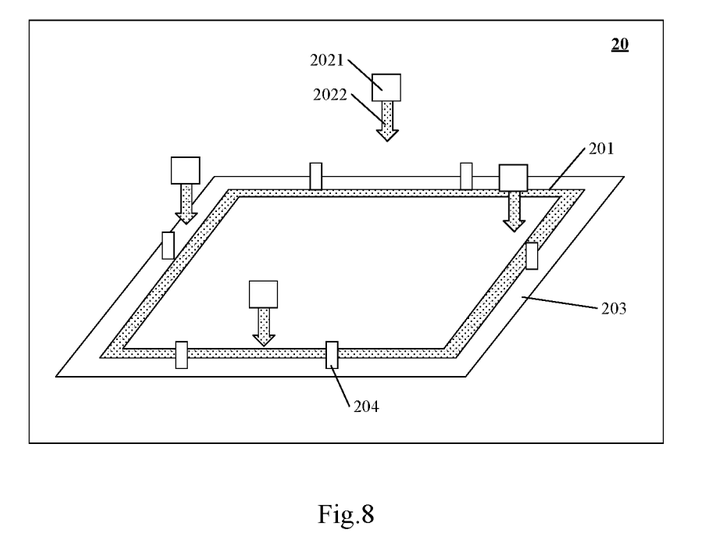
FIG. 8 is a schematic diagram of another photoresist drying device according to at least one embodiment of the present disclosure.

For example, as shown in FIG. 8, in one example, exposure device 202 may include four exposure light sources 2021 and four light guiding devices 2022. The four light guiding devices 2022 are respectively used to guide the light emitted by the four exposure light sources 2021, such that the emission ranges of the light guided by the four light guiding devices 2022 respectively correspond to four sides of the rectangular frame. In this case, one light guiding device 2022 is configured to guide the light emitted by one exposure light source 2021, such that the light emitting range guided by the one light guiding device 2022 is formed in a rectangle shape having a width ranges from about 8 mm to about 15 mm, thereby the emission ranges of the light guided by the four light guiding device 2022 can be formed in a rectangular frame shape by splicing. The above configuration of the example can reduce the design difficulty of the light guiding device 2022. In addition, in this example, the positions of the four exposure light sources 2021 and the four light guiding devices 2022 can be varied, such that the emission ranges of the light guided by the four light guiding devices 2022 can be formed in different shapes by splicing, thereby realizing different exposure ranges.

Figure 9:
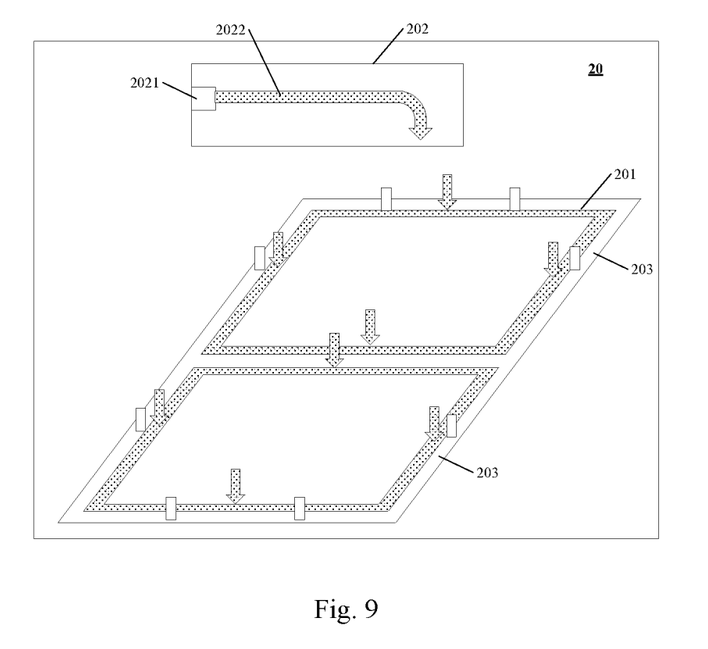
FIG. 9 is a schematic diagram of further another photoresist drying device according to at least one embodiment of the present disclosure.

In this embodiment, as shown in FIG. 9, the photoresist drying device 20 may include a plurality of carrying machine tables 203 (two carrying machine tables are shown in FIG. 9), and the plurality of carrying machine tables 203 may be independent with each other or may be formed as a whole. The plurality of carrying machine tables 203 may simultaneously carry a plurality of support substrates, such that the drying and exposure processes of the plurality of supporting substrates may be simultaneously performed in one photoresist drying device 20, thereby the photoresist drying device 20 can also improve production efficiency. In addition, in a case where the production efficiency is constant, the photoresist drying device 20 can increase working time for a support substrate, such that the support substrate can be more sufficiently dried and exposed.

The photoresist drying device provided by this embodiment can expose the photoresist in the edge region of the substrate to be operated while drying the photoresist, such that production time can be saved and the photoresist located in the edge region can be more sufficiently exposed. In addition, the photoresist which is not completely cured is more susceptible to be photo decomposed during a heating state of the drying process, and therefore the performing of the exposure process while the photoresist is dried can also improve an exposure efficiency of the exposure process. In a case where the photolithography process is performed by the photoresist drying device to pattern on the substrate to be operated, the photoresist does not remain in the edge region of the substrate to be operated, such that the finally obtained photoresist pattern is more accurate, and the pattern of the functional layer formed by the photolithography process is more in line with the expected pattern. For example, in a case where a flexible substrate is prepared by the photoresist drying device, the photoresist does not remain in the peripheral edge of the flexible substrate, such that the stripping process of the flexible array substrate can be simpler and easier.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, those skilled in the art may make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. A photolithography method, comprising:
providing a base substrate on which a material layer to be etched is formed, wherein the base substrate comprises an intermediate region and a peripheral region surrounding the intermediate region;
coating a layer of photoresist on the base substrate, wherein the photoresist is coated in the intermediate region and the peripheral region and is formed to cover the material layer to be etched; and
drying the photoresist and simultaneously performing a first exposure process on the photoresist coated in the peripheral region;
wherein after the photoresist is dried and the first exposure process is completed, the method further comprises:
performing a second exposure process on the photoresist coated in at least the intermediate region;
wherein after the second exposure process is completed, the method further comprises:
performing a development process on the photoresist coated in the intermediate region and the peripheral region, so as to form a photoresist pattern in the intermediate region of the base substrate and remove the photoresist in the peripheral region,
wherein the photoresist pattern is used as an etching mask.

2. The photolithography method according to claim 1, wherein the second exposure process is performed on the photoresist coated in the intermediate region and the peripheral region simultaneously.

3. The photolithography method according to claim 1, wherein the first exposure process comprises:
guiding light emitted from an exposure light source, by a light guiding device, so as to allow an emission range of the light guided by the light guiding device to correspond to the peripheral region.

4. The photolithography method according to claim 1, wherein the photoresist is a positive photoresist.

5. A method of preparing a flexible substrate, comprising:
forming a flexible material layer on a support substrate, wherein the support substrate comprises a flexible substrate formation region and a peripheral region surrounding the flexible substrate formation region;
performing a patterning process on the flexible material layer by a photolithography process, wherein the photolithography process comprises coating a layer of photoresist and drying the photoresist, and the photoresist is coated in the flexible substrate formation region and the peripheral region; and
performing a first exposure process on the photoresist coated in the peripheral region while drying the photoresist;
wherein after the photoresist is dried and the first exposure process is completed, the method further comprises:
performing a second exposure process on the photoresist coated in at least the flexible substrate formation region;
wherein after the second exposure process is completed, the method further comprises:
performing a development process on the photoresist coated in the flexible substrate formation region and the peripheral region, so as to form a photoresist pattern in the flexible substrate formation region and remove the photoresist in the peripheral region,
wherein the photoresist pattern is used as an etching mask for the patterning process.

6. The method of preparing the flexible substrate according to claim 5, wherein the photoresist is a positive photoresist.

7. The method of preparing the flexible substrate according to claim 5, wherein the first exposure process comprises:
guiding light emitted from an exposure light source by a light guiding device, so as to allow an emission range of the light guided by the light guiding device to correspond to the peripheral region.

8. The method of preparing the flexible substrate according to claim 7, wherein the emission range of the light is formed in a rectangular frame shape, and a width of a frame of the rectangular frame ranges from 8 mm to 15 mm.

9. The method of preparing the flexible substrate according to claim 8, further comprising:
after the photolithography process is completed, stripping off the flexible material layer from the support substrate to form the flexible substrate.

\* \* \* \* \*